(12) United States Patent
Oden et al.

(10) Patent No.: US 7,355,777 B2
(45) Date of Patent: Apr. 8, 2008

(54) ENERGY STORAGE STRUCTURES USING ELECTROMECHANICALLY ACTIVE MATERIALS FOR MICRO ELECTROMECHANICAL SYSTEMS

(75) Inventors: Patrick Ian Oden, McKinney, TX (US); William Craig McDonald, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/430,651

(22) Filed: May 9, 2006

(65) Prior Publication Data

US 2007/0263274 A1     Nov. 15, 2007

(51) Int. Cl.
G02F 1/03     (2006.01)
G02B 26/00    (2006.01)

(52) U.S. Cl. .......................... 359/245; 359/290

(58) Field of Classification Search ............... 359/290, 359/846, 245
See application file for complete search history.

(56) References Cited

U.S. PATENT DOCUMENTS

| | | | | |
|---|---|---|---|---|
| 5,536,963 A | * | 7/1996 | Polla | 257/417 |
| 5,867,202 A | * | 2/1999 | Knipe et al. | 347/239 |
| 5,914,507 A | * | 6/1999 | Polla et al. | 257/254 |
| 6,236,490 B1 | * | 5/2001 | Shen | 359/27 |
| 7,011,415 B2 | * | 3/2006 | DiCarlo et al. | 353/99 |
| 2004/0070815 A1 | * | 4/2004 | Aubuchon | 359/291 |
| 2005/0152017 A1 | * | 7/2005 | Reboa | 359/251 |
| 2006/0187529 A1 | * | 8/2006 | Hagood et al. | 359/298 |
| 2007/0008634 A1 | * | 1/2007 | Chiu | 359/847 |

* cited by examiner

Primary Examiner—Jordan Schwartz
Assistant Examiner—James C Jones
(74) Attorney, Agent, or Firm—Dawn V. Stephens; W. James Brady, III; Frederick J. Telecky, Jr.

(57) ABSTRACT

System and method for storing energy using electromechanically active materials in micro electromechanical systems. A preferred embodiment comprises a movable element, an intermediate layer formed under the movable element, and electrical addressing circuitry formed under the intermediate layer. The intermediate layer contains a hinge and at least one flexible member associated with the movable element, with the flexible member comprising a layer made from an electromechanically active material. The electromechanically active material contracts or deforms when an electric field is applied, helping the movable element move from a first position to a second position. The use of the electromechanically active material enables the flexible member to apply a greater force on the movable element to help the movable element overcome stiction.

21 Claims, 4 Drawing Sheets

ENERGY STORAGE STRUCTURES USING ELECTROMECHANICALLY ACTIVE MATERIALS FOR MICRO ELECTROMECHANICAL SYSTEMS

TECHNICAL FIELD

The present invention relates generally to a system and a method for micro electromechanical systems, and more particularly to a system and a method for storing energy using electromechanically active materials in micro electromechanical systems.

BACKGROUND

A digital micromirror device (DMD) is a type of micro electromechanical system (MEMS), wherein a large number of micromirrors are arranged in an array. Each micromirror in the DMD can pivot on a hinge about an axis to reflect light produced by a light source either away from or onto a display plane, based on image data. Light reflected away from the display plane corresponds to a dark region of an image, while light reflected onto the display plane corresponds to a light region of the image. A combination of light reflected by the micromirrors in the DMD produces an image on the display plane, with color being provided by a multi-color light source or the use of color filters.

The position of a micromirror can be determined by the state of a memory cell fabricated underneath the micromirror. If the memory cell is in a first state, the micromirror can pivot to a first position and if the memory cell is in a second state, the micromirror can pivot to a second position. Electrostatic forces are used to change the position of the micromirror from one position another. However, since each micromirror has a mass, sufficient energy must be provided to each micromirror to overcome any stiction (static friction) that will tend to keep the micromirror in its current position. The energy is also needed to overcome hinge memory that will preclude a successful position change. However, if too much energy is provided to move the micromirror, the micromirror may be accelerated to such a high velocity that permanent damage can occur to the micromirror and/or a micromirror landing site. Damage to the micromirror landing site can cause increased stiction, requiring greater energy to ensure the positive movement of the micromirror.

With reference to FIG. 1, there is shown a diagram illustrating portion of a DMD 100 showing a mechanical energy storing structure used in a DMD to provide energy to help ensure the positive movement of a micromirror. The mechanical energy storing structure in the DMD includes a flexible member 105 that can be attached to an immovable structure 110. The flexible member 105 can deflect in a downward direction when a micromirror 115 lands on the flexible member 105, storing mechanical energy that can be released to help assist the micromirror 115 pivot to a different position. The flexible member 105 can be fabricated from a metallic material, such as aluminum or an alloy of aluminum. The flexible member 105 can be attached to the immovable structure 110 or the flexible member 105 may be a formed from the immovable structure 110. The deflection of the flexible member 105 also helps to decelerate the micromirror 115 and reduce the deceleration impulse on the micromirror 115, which can help to mitigate damage to the micromirror 115 or a micromirror landing site.

SUMMARY OF THE INVENTION

These and other problems are generally solved or circumvented, and technical advantages are generally achieved, by preferred embodiments of the present invention which provide a system and a method for storing energy using electromechanically active materials used in micro electromechanical systems.

In accordance with a preferred embodiment of the present invention, a micro electromechanical system is provided. The system includes a movable element, an intermediate layer formed under the movable element, and electrical addressing circuitry formed under the intermediate layer. The intermediate layer forms a hinge and at least one flexible member associated with the movable element, the flexible member comprising a layer made from an electromechanically active material. The electrical addressing circuitry controls the operation of the micro electromechanical system.

In accordance with another preferred embodiment of the present invention, a method for manufacturing a micro electromechanical system is provided. The method includes forming a first spacer layer on electrical addressing circuitry and creating an intermediate layer, where the intermediate layer contains a flexible member with at least one layer made from an electromechanically active material. The method also includes forming a second spacer layer on the intermediate layer and creating a plurality of moveable elements on the second spacer layer.

In accordance with another preferred embodiment of the present invention, a method for operating a micro electromechanical system is provided. The method includes loading a state for a movable element into a memory associated with the movable element, and asserting an initiate movement signal on a signal line to move the movable element. The method also includes applying an electric field across a flexible member in mechanical contact with the movable element. The state loaded into the memory determines a position of the movable element.

An advantage of a preferred embodiment of the present invention is that the use of an electromechanically active material in a flexible member allows the flexible member to exert a greater amount of force onto the micromirror. Therefore, the use of the electromechanically active material can permit the use of a thinner (less massive) flexible member.

The foregoing has outlined rather broadly the features of the present invention in order that the detailed description of the invention that follows may be better understood. Additional features of the invention will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an array of spatial light modulators for an image display system, wherein the array of spatial light modulator is an array of micromirrors. The invention may also be applied, however, to other micro electromechanical systems, wherein there is a need to generate mechanical energy from electrical energy.

Figure 1:
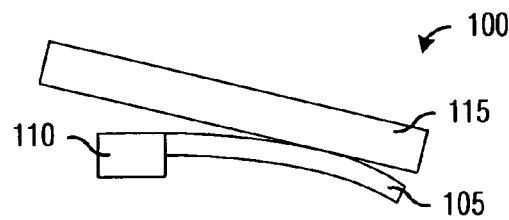
FIG. 1 is a diagram of a DMD with a mechanical energy storing structure.
Figure 2A:
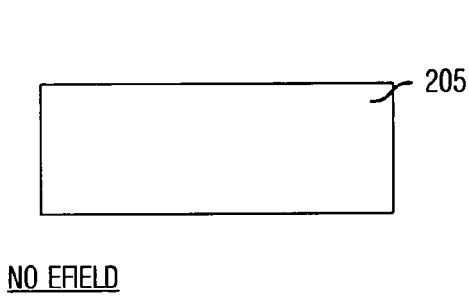
FIGS. 2a and 2b are diagrams of the behavior of electromechanically active materials.
Figure 2B:
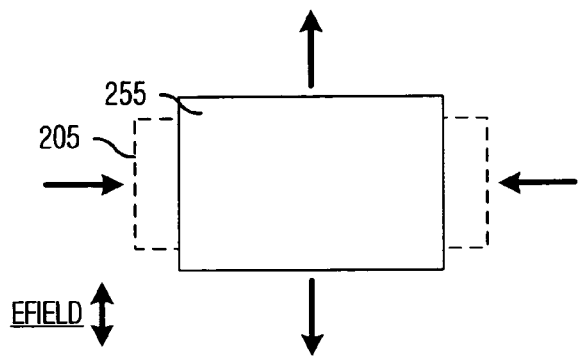

With reference now to FIGS. 2a and 2b, there are shown diagrams illustrating the behavior of electromechanically active materials in the presence of an electric field. An electromechanically active material is a material that is capable of distorting or deforming (e.g. contracting or expanding) under the presence of an applied electric field. The diagram shown in FIG. 2a illustrates a view of a rectangular piece of an electromechanically active material 205 at rest, without an applied electric field. The diagram shown in FIG. 2b illustrates a view of the rectangular piece of an electromechanically active material 205 with an applied electric field. The applied electric field is applied with a vertical polarity, either from a top to bottom direction or from a bottom to top direction. With the applied electric field's vertical polarity, the rectangular piece of an electromechanically active material 205 can contract along a horizontal direction while expanding along a vertical direction. A rectangle 255 can be representative of a rectangular piece of an electromechanically active material 205 with an applied electric field as shown in FIG. 2b.

There are several types of materials that are electromechanically active. These materials include electrostrictive materials, piezoelectric materials, and ferroelectric materials. Electrostrictive materials contract in the presence of an applied electric field and piezoelectric materials will distort in the presence of an applied electric field. Ferroelectric materials display a spontaneous dipole moment as well as the ability to contract in the presence of an applied electric field. In the absence of an applied electric field, the electromechanically active materials return to their non-contracted or non-distorted size. Examples of electrostrictive materials include single-crystal and multi-crystalline ceramics and polymers such as $CaF_2$, $SrF_2$, and crystalline $BaF_2$. Ferroelectrics are actually a sub-class of electrostrictive materials and include materials such as Barium Titanate (strains of about 0.9%), Lead Titanate (strains of about 2%), $PbZr_xTi_{(1-x)}O_3$, $Pb_{0.65}Ba_{0.35}Nb_2O_6$, and co-polymers of Vinyl-dieneflouride/Trifluoroethylene (P(VDF-TrFe)). Piezoelectric materials are typically ceramic and possess a non-centrosymmetric unit cell. Examples of piezoelectric materials include Rochelle salt, Ammonium Dihydrogen Phosphate $(NH_4)H_2PO_4$, Lithium Tantalate $(LiTaO_3)$, Lithium Niobate $(LiNbO_3)$, electrically poled ferroelectrics (ceramics) including $PbZrO_3$ and $PbTiO_3$, and so forth.

The flexible member 105, made entirely from a material(s) that is not electromechanically active, stores mechanical energy in the form of potential energy in a deflection of the flexible member 105. Typically, the greater the deflection, the greater the potential energy stored. The flexible member 105 will want to return to its normal state. When released from its deformed state, the flexible member 105, in returning to its normal state, will transfer its mechanical energy in the form of kinetic energy to the micromirror 115. In accordance with preferred embodiments of the present invention, it is possible to add an electromechanically active material to the flexible member 105 to increase the kinetic energy or enable a smaller flexible member while providing substantially the same amount of kinetic energy to the micromirror 115.

Figure 3A:
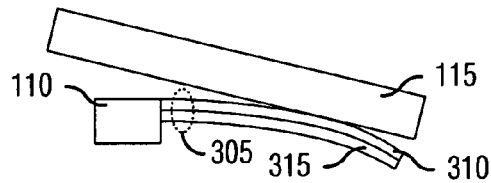
FIGS. 3a and 3b are diagrams of side views of a portion of an exemplary micromirror light modulator of a DMD, according to a preferred embodiment of the present invention.
Figure 3B:
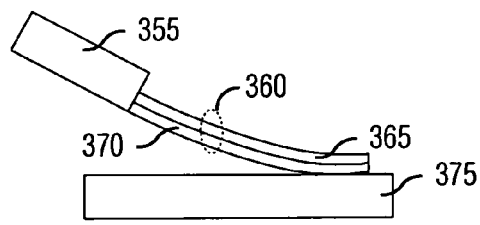

With reference now to FIGS. 3a and 3b, there are shown diagrams illustrating a side view of a portion of an exemplary micromirror light modulator of a DMD, according to a preferred embodiment of the present invention. The diagram shown in FIG. 3a illustrates a side view of a portion of a micromirror light modulator of a DMD, wherein the micromirror 115 lands directly onto a flexible member 305. The flexible member 305 comprises two distinct layers, a first layer 310 being a layer of an electromechanically active material, such as an electrostrictive material, a piezoelectric material, or a ferroelectric material, and a second layer 315 being a layer of a metallic material, such as aluminum or an alloy of aluminum. The flexible member 305 can be attached to an immovable structure 110.

The micromirror 115 deflects the flexible member 305 downward when the micromirror 115 lands on the flexible member 305, resulting in the storage of potential energy in the flexible member 305. However, when the micromirror 115 is to change state, an electric field is applied across the flexible member 305 and the micromirror 115 to cause the first layer 310 (the layer made of an electromechanically active material) to contract or deform. The electric field applied perpendicular to the flexible member 305 can cause a compressive stress in the first layer 310, which will result in an upward motion of the flexible member 305. The kinetic energy provided by the compression of the first layer 310, in combination with the potential energy stored in the deflection of the flexible member 305, pushes the micromirror 115 into motion, overcoming stiction.

Applying an electric field perpendicular to the flexible member 305 generally requires that the flexible member 305 and the micromirror 115 be at different electrical potentials from each other, else it would not be possible to apply a bias across the flexible member 305 and the micromirror 115. For example, it is possible to complete an electrical circuit when the micromirror 115 makes contact with the flexible member 305, and an electrical field can be applied when it is desired to change the position (state) of the micromirror 115.

The diagram shown in FIG. 3b illustrates a side view of a portion of a micromirror light modulator of a DMD, wherein a micromirror (not shown) is attached to a yoke 355 that moves in conjunction with the micromirror. The yoke 355 has attached, a flexible member 360 that comprises a first layer 365 formed from a metallic material, such as aluminum or an alloy of aluminum, and a second layer 370 formed from an electromechanically active material. As the yoke 355 (and the micromirror) lands on a landing pad 375, the flexible member 360 is deflected upwards and stores potential energy. Then, when the micromirror is to move, an electric field is applied and the second layer 370 contracts or deforms and causes the flexible member 360 to deflect downwards. The movement of the flexible member 360 along with the potential energy stored in the flexible member 360 helps the yoke 355 move and the micromirror change position (state).

Figure 4A:
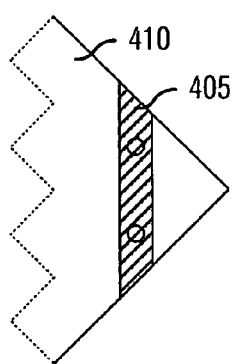
FIGS. 4a through 4c are diagrams of exemplary micromirror light modulators of DMDs, according to a preferred embodiment of the present invention.
Figure 4B:
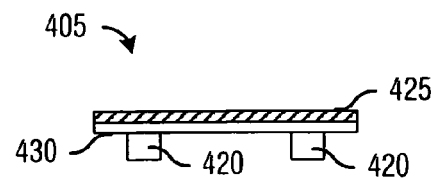
Figure 4C:
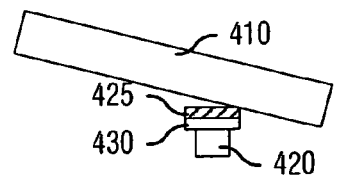

The flexible members 305 and 360 shown in FIGS. 3a and 3b make contact with the micromirror 115 or yoke 355 with a small surface area. It is possible to increase the contact surface area with an alternative embodiment of the flexible member. The diagrams shown in FIGS. 4a through 4c illustrate different views of an alternative embodiment of a DMD with a flexible member 405, wherein the contact area between the flexible member 405 and a micromirror 410 (or a yoke (not shown)) is a linear portion of the micromirror 410, according to a preferred embodiment of the present invention. The diagram shown in FIG. 4a illustrates a top view of the DMD, wherein a footprint of a portion of the micromirror 410 is disposed over the flexible member 405. The diagram shown in FIG. 4b illustrates a front view of the flexible member 405, displaying a pair of support vias 420, a first layer 425, and a second layer 430, wherein the first layer 425 is created using an electromechanically active material and the second layer 430 is formed from a metallic material. The diagram shown in FIG. 4c illustrates a side view of the DMD, displaying the micromirror 410 resting on the flexible member 405.

Figure 5A:
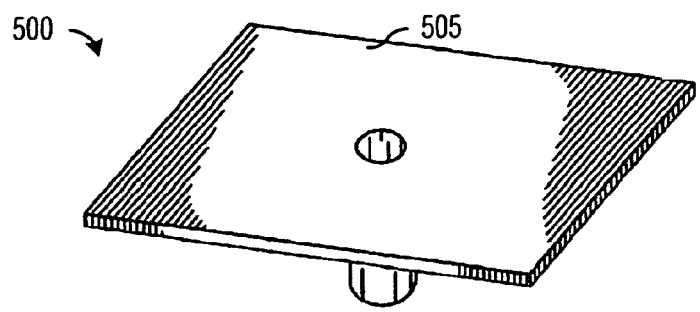
FIGS. 5a and 5b are diagrams of DMDs, according to a preferred embodiment of the present invention.
Figure 5A:
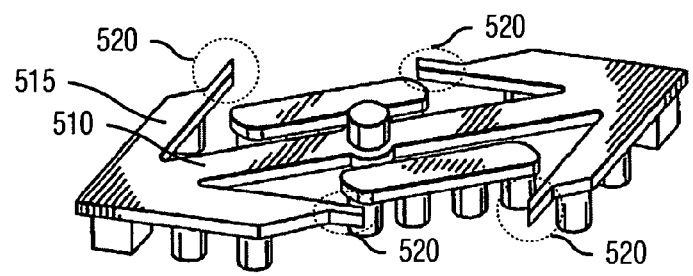
Figure 5B:
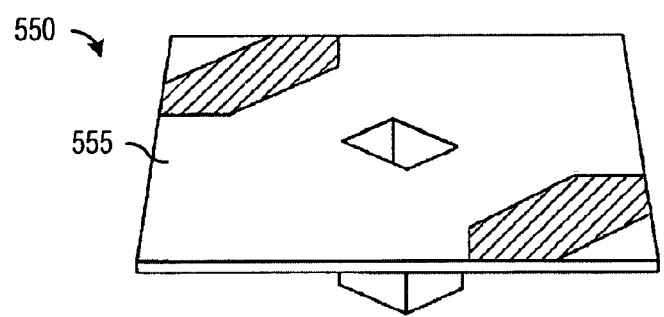
Figure 5B:
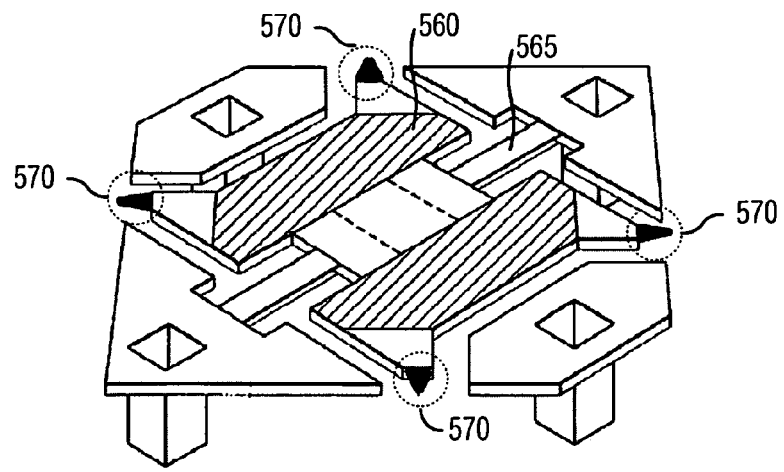

With reference now to FIGS. 5a and 5b, there are shown diagrams illustrating isometric views of portions of exemplary micromirror light modulators, according to a preferred embodiment of the present invention. The diagram shown in FIG. 5a illustrates an isometric view of a micromirror light modulator 500 of a DMD, wherein the micromirror light modulator 500 features a micromirror 505 that is directly attached to a hinge 510. The micromirror 505 pivots about the hinge 510, that is attached to a hinge support structure 515, and lands on flexible members 520 that are a part of the hinge support structure 515. The flexible members 520 shown in FIG. 5a are of the type shown in FIGS. 3a and 3b. It is also possible to alter the design of the flexible member 520 to implement a bridge implementation of a flexible member, such as shown in FIGS. 4a through 4c. The diagram shown in FIG. 5a does not illustrate electrical addressing circuitry of the micromirror light modulator. A detailed discussion of the micromirror light modulator 500 as shown in FIG. 5a is provided in U.S. Pat. No. 7,011,415, which is co-assigned and incorporated herein by reference.

The diagram shown in FIG. 5b illustrates an isometric view of a micromirror light modulator 550 of a DMD, wherein the micromirror light modulator 550 features a micromirror 555 that is attached to a yoke 560, which is coupled to a hinge 565. The micromirror 555 and the yoke 560 pivot about the hinge 565. The yoke 560 includes flexible members 570 that land on a landing pad (not shown) as the micromirror 555 and the yoke 560 changes position (state). The diagram shown in FIG. 5b does not illustrate electrical addressing circuitry of the micromirror light modulator. A detailed discussion of the micromirror light modulator 550 as shown in FIG. 5b is provided in U.S. Pat. No. 5,867,202, which is co-assigned and incorporated herein by reference.

Figure 6A:
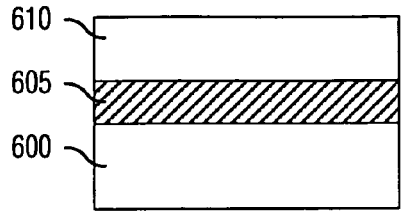
FIGS. 6a through 6f are diagrams of cross-sectional views of a portion of a micromirror light modulator during the fabrication of the micromirror light modulator, according to a preferred embodiment of the present invention.

With reference now to FIGS. 6a through 6f, there are shown diagrams illustrating exemplary cross-sectional views of a portion of a micromirror light modulator during the fabrication of the micromirror light modulator, according to a preferred embodiment of the present invention. The diagram shown in FIG. 6a illustrates the layers of a micromirror light modulator up to a first spacer layer 610, which can be removed after the completed fabrication of the micromirror light modulator to provide a gap needed for the proper function of the micromirror light modulator, i.e., free space to permit movement of the micromirror. In this example, the fabrication of the micromirror light modulator begins with a completed CMOS memory circuit 600. The CMOS memory circuit 600 can be a conventional synchronous RAM cell formed on a substrate. Prior to the fabrication of the micromirror light modulator, a thick oxide layer (not shown) can be deposited over the CMOS memory circuit 600 and then planarized to provide a flat substrate for the fabrication of the micromirror light modulator. The planarization can be performed using chemical mechanical polishing (CMP) techniques, for example.

Prior to the deposition of the first spacer layer 610, a metal layer 605 can be formed above the CMOS memory circuit 600. The metal layer 605 can be used to create address and bus circuitry. For example, aluminum or an alloy of aluminum can be sputter deposited on the CMOS memory circuit 600 and then portions of the metal layer 605 can be etched away using a plasma etch. The first spacer layer 610 can then be deposited over the metal layer 605 and can be a hardened resist layer. A number of vias (not shown) can then be formed in the first spacer layer 610 using conventional patterning and etching techniques. The vias can be used to provide electrical connectivity between the address and bus circuits in the metal layer 605 and subsequent layers of the micromirror light modulator.

Figure 6B:
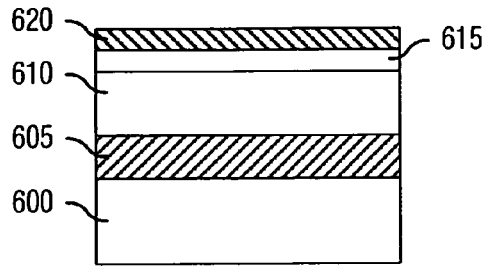
Figure 6C:
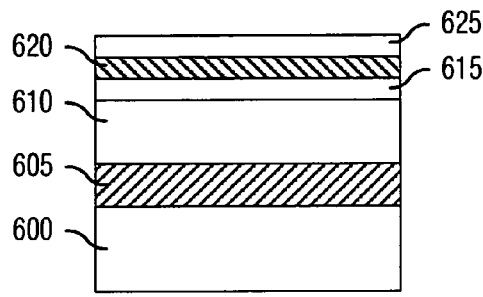

The diagram shown in FIG. 6b illustrates the fabrication of a hinge and flexible member layer 615. The hinge and flexible member layer 615 contains the hinges 510, hinge support structures 515, and flexible members 520 (all of FIG. 5a). The hinge and flexible member layer 615 can be formed by a deposition of a metal layer. The hinges and the flexible members are typically formed from an aluminum alloy, such as AlTiO. With the hinge and flexible member layer 615 deposited, an electromechanically active material layer 620 can be deposited over the hinge and flexible member layer 615. Examples of an electromechanically active material can be one of the many discussed above, such as single-crystal and multi-crystalline ceramics and polymers such as $CaF_2$, $SrF_2$, and crystalline $BaF_2$, or Barium Titanate (strains of about 0.9%), Lead Titanate (strains of about 2%), $PbZr_xTi_{(1-x)}O_3$, $Pb_{0.65}Ba_{0.35}Nb_2O_6$, and co-polymers of Vinyldieneflouride/Trifluoroethylene (P(VDF-TrFe)).

The electromechanically active material layer 620 can then be patterned and etched to remove the electromechanically active material over hinge, hinge support structure, and so forth locations, leaving only electromechanically active material over flexible member locations. A resist layer 625 can be deposited and patterned to be used to remove the unwanted electromechanically active material (shown in FIG. 6*c*). After the etching of the electromechanically active material layer 620, the resist layer 625 can be removed with a resist strip fabrication process.

Figure 6D:
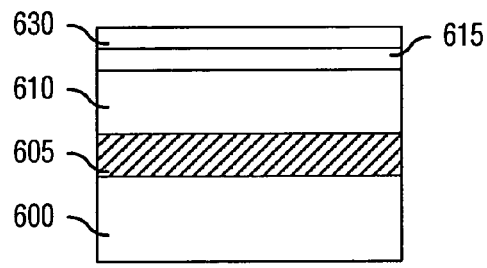

With the electromechanically active material layer 620 patterned and etched to remove the electromechanically active material except at the flexible member locations, a resist layer 630 can be deposited and then patterned to create the hinge and hinge support structures (shown in FIG. 6*d*). After the etching of the hinge and flexible member layer 615, the resist layer 630 can also be removed with a resist strip fabrication process.

Figure 6E:
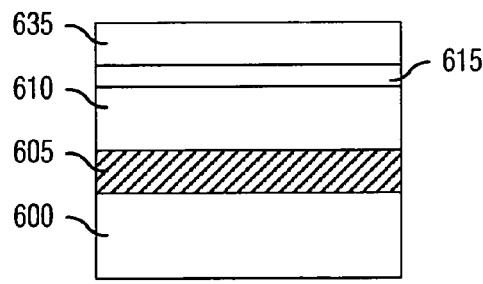

The diagram shown in FIG. 6*e* illustrates the fabrication of a second spacer layer 635. The second spacer layer 635 can be a hardened resist layer and can be deposited over the hinge and flexible member layer 615. Mirror vias (not shown) can be patterned into the second spacer layer 635. Mirror vias permit the attachment of a reflective mirror surface of a micromirror to a hinge in the hinge and flexible member layer 615.

Figure 6F:
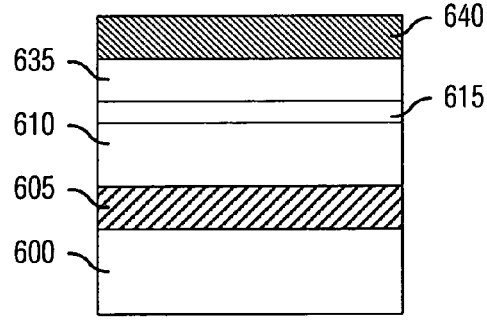

A reflective mirror surface layer 640 can then be deposited over the second spacer layer 635 (shown in FIG. 6*f*). According to a preferred embodiment of the present invention, layer 640 can be deposited using a technique, such as sputter deposition in an advanced low pressure source chamber, that ensures adequate coverage of the walls of the mirror vias to provide a good connection between the reflective mirror surface to a hinge in the hinge and flexible member layer 615. The reflective mirror surface can be formed from aluminum or an alloy of aluminum, for example. The reflective mirror surface layer 640 can then be etched to pattern individual mirrors, such as shown in FIG. 5*a*. A plasma etch can then be used to remove the first spacer layer 610 and the second spacer layer 635 to free the micromirror and allow it to pivot about the hinge to which it is attached.

Figure 7A:
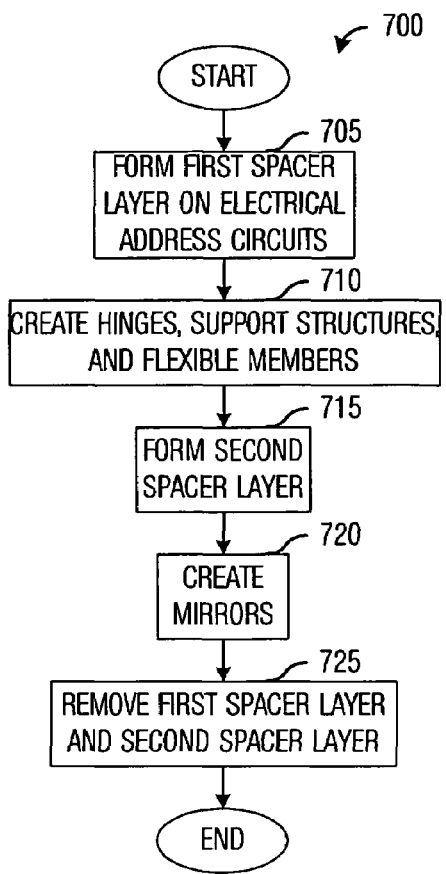
FIGS. 7a through 7c are diagrams of sequences of events in the fabrication of a micromirror light modulator, according to a preferred embodiment of the present invention.
Figure 7B:
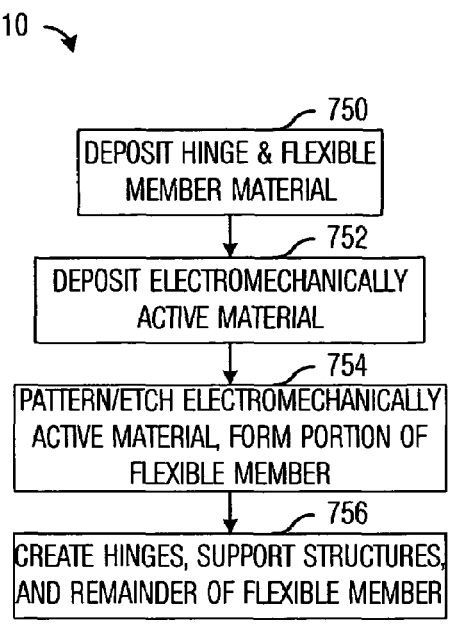
Figure 7C:
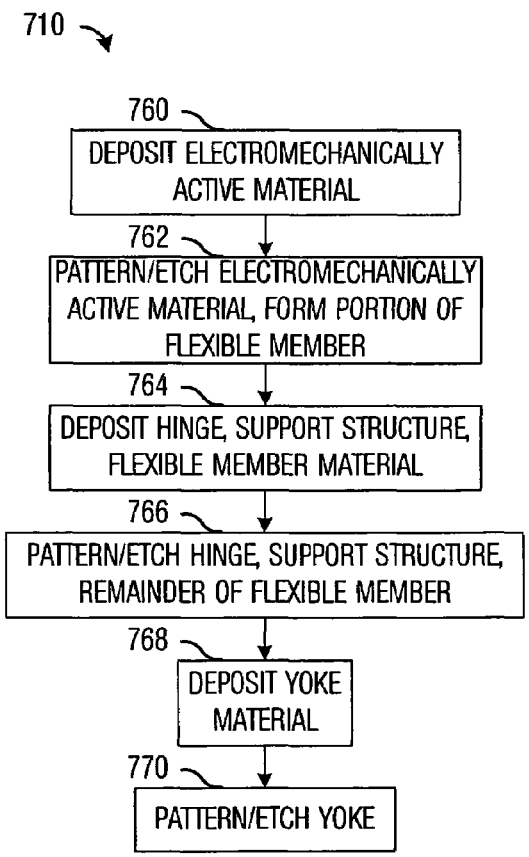

With reference now to FIGS. 7*a* through 7*c*, there are shown diagrams illustrating a sequence of events 700 in the manufacture of a DMD with flexible members utilizing electromechanically active materials, according to a preferred embodiment of the present invention. The sequence of events 700 shown in FIG. 7*a* illustrates a high level view of the manufacture of a DMD containing a large number of micromirror light modulators on a wafer, wherein the DMD features flexible members that contain electromechanically active materials to help the micromirrors change position. The sequence of events 700 provides a view of the manufacture of the DMD after the fabrication of necessary memory circuits and electrical addressing circuitry has already taken place on the wafer.

After the formation of the necessary memory circuits and electrical addressing circuitry, the fabrication of the DMD with flexible members can continue with the formation of a first spacer layer over the memory circuits and the electrical addressing circuits (block 705). The first spacer layer can be formed using a resist material and, after allowing the resist material to harden, vias to permit electrical connectivity between the electrical addressing circuits and subsequent structures in the DMD can be created using conventional patterning and etching techniques. After the formation of the first spacer layer and the patterning and etching of vias, hinges, support structures, flexible members, and so forth are created (block 710). The micromirrors (to be created later) pivot about the hinges, while support structures provide necessary support for the hinges and the micromirrors, and flexible members aid the micromirrors in overcoming stiction that can prevent the micromirrors from changing state as well as helping to reduce the landing impulse that can damage the micromirror. A detailed discussion of the creation of the hinges, support structures, and flexible members is provided below.

With the creation of the hinges, support structures, and flexible members completed, a second spacer layer can be created on top of the layer containing the hinges, support structures, and flexible members (block 715). The second spacer layer can be created using the same resist material that was used to create the first spacer layer (block 705). With the second spacer layer hardened, the second spacer layer can be patterned and etched to create mirror vias that will permit the attachment of the micromirrors to the hinges. As with the first spacer layer, the patterning and etching of the second spacer layer can be performed using typical patterning and etching techniques. The micromirrors can then be created (block 720). The micromirror can be created by depositing a metallic layer over the second spacer layer. The metallic material can be aluminum or an alloy of aluminum, for example. The deposition of the metallic layer should be performed using a technique that will allow for good coverage of the sidewalls of the mirror vias to ensure a good physical connection between the micromirrors and the hinges. The creation of the mirrors can be completed with an etch to separate the individual micromirrors. Finally, an etch, such as a plasma etch, can be performed to remove the first spacer layer and the second spacer layer (block 725). The removal of first spacer layer and the second spacer layer frees the micromirrors, allowing them to pivot about the hinges to which they are attached.

With reference now to FIG. 7*b*, there is shown a diagram illustrating a sequence of events in the creation of hinges, support structures, and flexible members for a DMD, wherein the micromirrors of the DMD land directly on the flexible members, according to a preferred embodiment of the present invention. The sequence of events shown in FIG. 7*b* can be an implementation of block 710, create hinges, support structures, and flexible members, in FIG. 7*a*. The creation of the hinges, support structures, and flexible members can begin with the deposition of a material that is used in the creation of the hinges, support structures, and flexible members (block 750). The material, for example, aluminum or an alloy of aluminum, can be sputter deposited. After the material used in the creation of the hinges, support structures, and flexible members has been deposited (block 750), then an electromechanically active material can be deposited (block 752). According to a preferred embodiment of the present invention, the electromechanically active material can be deposited using sputter deposition and/or pulsed laser deposition, for example.

After deposition of the electromechanically active material, typical patterning and etching process techniques can be used to remove the electromechanically active material except for the electromechanically active material to be used for the flexible members (block 754). For example, a resist layer can be deposited over the electromechanically active material and then the resist layer can be patterned with a pattern to leave the electromechanically active material over the intended position of the flexible members. Then, the resist layer can be developed and used in an etching process to remove unwanted electromechanically active material. Once the electromechanically active material has been etched, the resist can be removed (stripped). With the electromechanically active material removed except for the material used in the flexible members, another resist layer can be deposited and patterned to be used in a different etching process to create the hinges, support structures, and a remaining portion of the flexible member (block 756). After the hinges and support structures have been etched, the resist layer can be stripped.

With reference now to FIG. 7*c*, there is shown a diagram illustrating a sequence of events in the creation of hinges, support structures, and flexible members for a DMD, wherein the micromirrors of the DMD move on a rigid yoke structure that includes the flexible members, according to a preferred embodiment of the present invention. The sequence of events shown in FIG. 7*b* can be an implementation of block 710, create hinges, support structures, and flexible members, in FIG. 7*a*. Due to the design of the DMD, the flexible members are attached to the rigid yoke structure and make contact with a landing pad when the micromirror comes to a rest. The creation of the hinges, support structures, and flexible members can begin with the deposition of an electromechanically active material to form a layer of the electromechanically active material (block 760). The layer of electromechanically active material can then be covered with a layer of resist that can then be patterned and used in an etching process to form a portion of the flexible members (block 762). The resist layer can then be stripped.

After the electromechanically active material layer has been etched to form a portion of the flexible member (block 762), then a layer of material (for example, aluminum or an alloy of aluminum) used to form hinges and support structures can be deposited (block 764). The material can also be used to form the remainder of the flexible members. The layer of material used to form hinges, support structures, and flexible members can then be covered with a layer of resist that can then be patterned and used in an etching process to form the hinges, support structures, and the flexible members (block 766). A yoke for each micromirror can then be created with a deposition of a layer of material used by the yoke (block 768) and a patterning, developing, and etching of a resist layer used to create the yoke (block 770).

Figure 8:
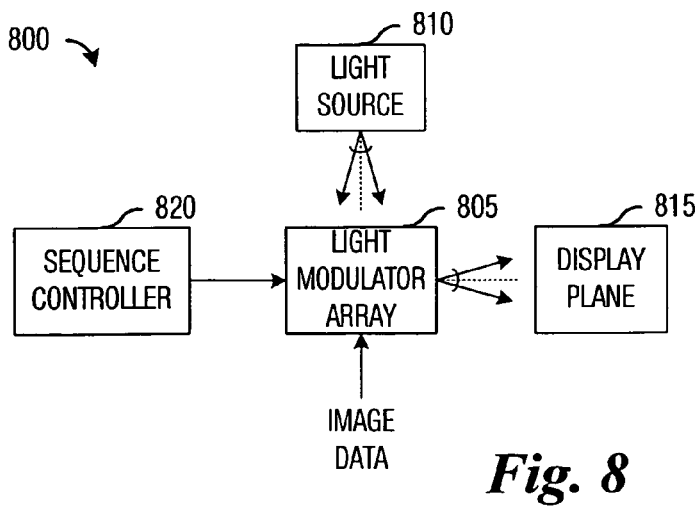
FIG. 8 is a diagram of a display system, according to a preferred embodiment of the present invention.

With reference now to FIG. 8, there is shown a diagram illustrating an exemplary display system 800, wherein the display system 800 utilizes an array of micromirror light modulators 805 (also referred to as a DMD), according to a preferred embodiment of the present invention. The individual light modulators in the DMD 805 assume a state that corresponds to image data for an image being displayed by the display system 800, wherein, depending upon the image data, an individual light modulator can either reflect light from a light source 810 away from or towards a display plane 815. A combination of the reflected light from all of the light modulators in the DMD 805 produces an image corresponding to the image data. A sequence controller 820 coordinates the loading of the image data into the DMD 805, controlling the light source 810, and so forth.

Figure 9:
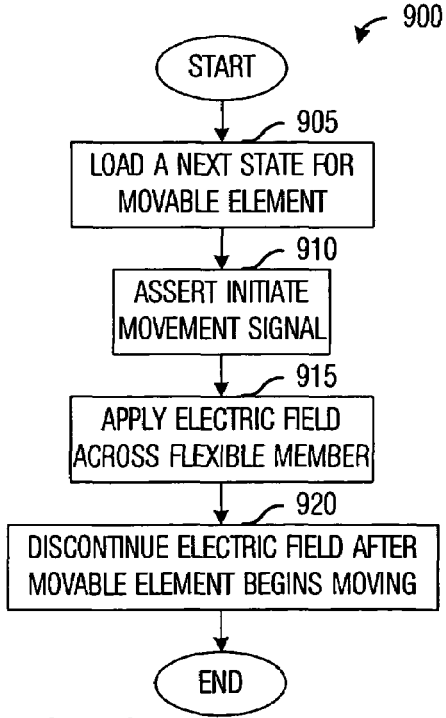
FIG. 9 is a diagram of a sequence of events in the operation of a micromirror light modulator, according to a preferred embodiment of the present invention.

With reference now to FIG. 9, there is shown a diagram illustrating a sequence of events 900 in the operation of a micromirror light modulator, according to a preferred embodiment of the present invention. The diagram shown in FIG. 9 illustrates events in the operation of the micromirror light modulator that involves the movement of the micromirror as it changes position (state) depending on image data. Although the sequence of events 900 illustrates the operations for a single micromirror light modulator, all of the micromirrors in the array of micromirror light modulators undergo the same sequence of events 900.

The sequence of events 900 can begin with a loading of a next state for the micromirror into a memory that is associated with the micromirror (block 905). Depending upon the value loaded into the memory, the micromirror may remain in its current position (state) or change to a new position. Independent of the state, the movement of the micromirror can be initiated. If the micromirror is to remain in its current position, then the micromirror will return to its current position. This transition is referred to as a same-side transition (SST). If the micromirror is to change to a new position, then the micromirror will transition to its new position. This transition is referred to as a cross-over transition (COT).

With the next state loaded into the memory, an initiate movement signal can be asserted on a signal line (block 910). For example, the initiate movement signal may be a reset pulse asserted on a global or a local reset line. The initiate movement signal can cause sufficient electrostatic potential to begin the movement of the micromirror. Either at substantially the same time as the assertion of the initiate movement signal or slightly after the assertion of the initiate movement signal, an electric field can be applied across the flexible member (block 915). The application of the electric field can cause the flexible member to contract or deform and impart a force on the movable element that will help it overcome any stiction. After the movable element begins to move, the electric field can be discontinued (block 920).

As the movable element begins to come to a rest at a position that is consistent with the value loaded into the memory, either at a new position or back to its current position, the movable element will begin to make contact with the flexible member and start to deform the flexible member. The deformation of the flexible member will absorb some of the kinetic energy present in the movable element and store the kinetic energy in the deformed flexible member and ready the micromirror light modulator to once again change state.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A micro electromechanical system comprising:
   a movable element;
   an intermediate layer formed under the movable element and displaced from the movable element, the intermediate layer having at least one flexible member associated with the movable element, the flexible member comprising a layer made from an electromechanically active material; and
   a single layer of metallic material having electrical addressing circuitry formed under the intermediate layer, the electrical addressing circuitry configured to control the operation of the micro electromechanical system, and wherein the movable element selectively decouples from the intermediate layer in response to an electric field being applied across the flexible member.

2. The micro electromechanical system of claim 1, wherein the electromechanically active material is a material that contracts or deforms when an electric field is applied.

3. The micro electromechanical system of claim 2, wherein the electromechanically active material is selected from the group consisting of: electrostrictive materials, piezoelectric materials, ferroelectric materials, and combinations thereof.

4. The micro electromechanical system of claim 2, wherein the movable element is pivotable between a first position and a second position, and wherein prior to the movable element pivoting, an electric field is applied to the flexible member.

5. The micro electromechanical system of claim 1, wherein the electromechanically active material is selected from the group consisting of: CaF2, SrF2, crystalline BaF2, and combinations thereof.

6. The micro electromechanical system of claim 1, wherein the electromechanically active material is selected from the group consisting of: barium titanate, lead titanate, PbZrxTi(1-x)O3, Pb0.65Ba0.35Nb2O6, co-polymers of vinyldieneflouride/trifluoroethylene (P(VDF-TrFe)), and combinations thereof.

7. The micro electromechanical system of claim 1, wherein the intermediate layer further comprises a hinge and the flexible member further comprises a second layer made from a same material as the hinge.

8. The micro electromechanical system of claim 1, wherein the movable element lands on the flexible member, and wherein the movable element lands on the layer of electromechanically active material.

9. The micro electromechanical system of claim 1, wherein the movable element pivots between two positions, wherein a flexible member is a cantilever that makes contact with a small part of the movable element, and wherein there is one or more flexible members making contact with the movable element at each of the two positions.

10. The micro electromechanical system of claim 1, wherein the movable element pivots between two positions, wherein a flexible member is a bridge that makes contact with a linear portion of the movable element, and wherein there is one flexible member making contact with the movable element at each of the two positions.

11. A method of manufacturing a micro electromechanical system, the method comprising:
forming a movable element:
forming an intermediate layer under the movable element and displaced from the movable element, the intermediate layer having at least one flexible member associated with the movable element;
forming the flexible member of a layer made from an electromechanically active material;
forming a single layer of metallic material having electrical addressing circuitry under the intermediate layer; and
forming the movable element for selectively decoupling the intermediate layer in response to an electric field being applied across the flexible member.

12. The method of claim 11 further comprising:
forming a first spacer layer on electrical addressing circuits on a substrate;
forming a second spacer layer on the intermediate layer; and forming the flexible member and the movable element on the second spacer layer.

13. A spatial light modulator comprising:
a micro-mirror for selective movement between at least two positions;
a flexible member displaced from the micro-mirror, the flexible member comprising a layer of an electromechanically active material and a layer of metallic material having electrical addressing circuitry formed under the flexible member,
wherein the electrical addressing circuitry controls selective movement of the micro-mirror, between the at least two positions, and
the micro-mirror selectively couples and decouples to the flexible member when the micro-mirror is in one of the positions.

14. The spatial light modulator of claim 13, furthering comprising an intermediate layer forming a hinge and the flexible member, wherein the flexible member further comprises a second layer made from a same material as the hinge.

15. The spatial light modulator of claim 13, wherein the micro-mirror selectively couples and decouples as an electric field is either applied across the flexible member or no longer applied across the flexible member.

16. The spatial light modulator of claim 13, wherein potential energy is stored in a second flexible member with the micro-mirror deforming the second flexible member as the micro-mirror comes to a rest.

17. The spatial light modulator of claim 13, wherein the electromechanically active material is a material that contracts or deforms when an electric field is applied.

18. The micro electromechanical system of claim 13, wherein the electromechanically active material is selected from the group consisting of: electrostrictive materials, piezoelectric materials, ferroelectric materials, and combinations thereof.

19. The spatial light modulator of claim 13, wherein the electromechanically active material is selected from the group consisting of: CaF2, SrF2, crystalline BaF2, barium titanate, lead titanate, PbZrxTi(1-x)O3, Pb0.65Ba0.35Nb2O6, co-polymers of vinyldieneflouride/trifluoroethylene (P(VDF-TrFe)), and combinations thereof and combinations thereof.

20. The spatial light modulator of claim 13, wherein the micro-mirror pivots between two positions, wherein the flexible member is a cantilever that makes contact with a small part of the movable element, and wherein there is one or more flexible members making contact with the movable element at each of the two positions.

21. The spatial light modulator of claim 13, wherein the micro-mirror pivots between two positions, wherein the flexible member is a bridge that makes contact with a linear portion of the movable element, and wherein there is one flexible member making contact with the movable element at each of the two positions.

* * * * *